United States Patent
Chang et al.

(10) Patent No.: US 8,349,126 B2
(45) Date of Patent: Jan. 8, 2013

(54) APPARATUS FOR ETCHING EDGE OF WAFER

(75) Inventors: Chong-Kwang Chang, Buncheon-si (KR); Oh-Sang Cho, Hwaseong-si (KR); In-Keun Lee, Yongin-si (KR); Hyo-Jeong Kim, Anyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 262 days.

(21) Appl. No.: 12/710,801

(22) Filed: Feb. 23, 2010

(65) Prior Publication Data
US 2010/0212833 A1 Aug. 26, 2010

(30) Foreign Application Priority Data

Feb. 24, 2009 (KR) ........................ 10-2009-0015412

(51) Int. Cl.
*C23C 16/00* (2006.01)
*C23F 1/00* (2006.01)
*H01L 21/306* (2006.01)

(52) U.S. Cl. ......... 156/345.43; 156/345.33; 156/345.44; 156/345.45; 156/345.47; 156/345.51; 118/723 E; 118/723 ER; 118/728

(58) Field of Classification Search ............. 156/345.33, 156/345.43–345.47, 345.51; 118/723 E, 118/723 ER, 728–730
See application file for complete search history.

(56) References Cited

U.S. PATENT DOCUMENTS

| | | | |
|---|---|---|---|
| 6,344,105 B1 | 2/2002 | Daugherty et al. | |
| 2005/0178505 A1* | 8/2005 | Kim | 156/345.47 |
| 2005/0189068 A1* | 9/2005 | Suzuki et al. | 216/67 |
| 2007/0068900 A1* | 3/2007 | Kim et al. | 216/67 |
| 2008/0182412 A1* | 7/2008 | Bailey, III et al. | 438/689 |

FOREIGN PATENT DOCUMENTS

| KR | 10-2007-0066934 | 6/2007 |
|---|---|---|
| KR | 10-2007-0113778 | 11/2007 |

OTHER PUBLICATIONS

English Abstract for Publication No. 10-2007-0066934.
English Abstract for Publication No. 10-2007-0113778.

* cited by examiner

*Primary Examiner* — Rakesh Dhingra
(74) *Attorney, Agent, or Firm* — F. Chau & Associates, LLC

(57) ABSTRACT

An apparatus for etching an edge of a wafer includes a chamber, a chuck disposed inside the chamber upon which the wafer is disposed, a plate spaced apart from the wafer and disposed above the wafer, and an edge ring formed along the edge of the wafer and combined with an outer periphery of the plate, wherein the edge ring comprises a ring base spaced a distance apart from the wafer to form a parallel plane with respect to the wafer, and a first ring protrusion protruding from the ring base to insulate the edge of the wafer from a central region of the wafer.

16 Claims, 8 Drawing Sheets

APPARATUS FOR ETCHING EDGE OF WAFER

CROSS-REFERENCE TO RELATED APPLICATION

This application claims priority under 35 U.S.C. §119 from Korean Patent Application No. 10-2009-0015412 filed on Feb. 24, 2009 in the Korean Intellectual Property Office, the contents of which are herein incorporated by reference in their entirety.

BACKGROUND

1. Field of the Invention

The present disclosure is directed to an apparatus for etching an edge of a wafer, and more particularly, to an apparatus for etching an edge of a wafer, which is constructed to prevent the wafer from being over-etched.

2. Description of the Related Art

There are two methods of etching an edge of a wafer, in which underlying layers are removed along photoresist patterns formed on a wafer: wet etching and dry etching. In a dry etching process, an appropriate gas is injected into a process chamber to induce a plasma, and ionized particles in the plasma are then allowed to collide with the surface of the wafer for removal through physical or chemical reactions.

In a dry etching apparatus, a polymer is generated as an etching byproduct as the result of the reaction between the wafer and the etching gases. Micro-particles of such polymers may be deposited on an edge portion of the wafer and remain thereon.

However, particles remaining on an edge portion of the wafer may cause deterioration of the wafer yield. Therefore, various techniques for removing particles from an edge of a wafer have been proposed.

Existing methods for removing particles from an edge of a wafer include an exposure followed by wet etching, and dry etching using plasma.

When the particles existing on the edge of the wafer are removed by dry etching, plasma may penetrate the chip as well as the edge of the wafer, resulting in over-etching of the wafer.

SUMMARY

Embodiments of the present invention provide an apparatus for etching an edge of a wafer, which is constructed to prevent the wafer from being over-etched.

The above and other objects of embodiments of the present invention will be described in or be apparent from the following description of exemplary embodiments.

According to an aspect of the present invention, there is provided an apparatus for etching an edge of a wafer, including a chamber, a chuck disposed inside the chamber upon which the wafer is disposed, a plate spaced apart from the wafer and disposed above the wafer, and an edge ring formed along the edge of the wafer and combined with an outer periphery of the plate, wherein the edge ring comprises a ring base spaced a distance apart from the wafer to form a parallel plane with respect to the wafer, and a first ring protrusion protruding from the ring base to insulate the edge of the wafer from a central region of the wafer.

According to another aspect of the present invention, there is provided an apparatus for etching an edge of a wafer, including a chamber, a chuck disposed inside the chamber adapted for receiving a wafer, a plate spaced apart from and disposed above the chamber forming a space therebetween, an edge ring formed along an outer periphery of the plate having a ring base and a first ring protrusion protruding from the ring base toward the chuck, and a gas nozzle disposed outside the first ring protrusion to supply an etching gas, wherein the first ring protrusion is disposed inward relative to an edge of a wafer disposed on the chuck to prevent the etching gas from penetrating into a space above a central region of the wafer.

DETAILED DESCRIPTION OF EXEMPLARY EMBODIMENTS

Features of embodiments of the present invention and methods of accomplishing the same may be understood more readily by reference to the following detailed description of exemplary embodiments and the accompanying drawings. Embodiments of the present invention may, however, be embodied in many different forms and should not be construed as being limited to the embodiments set forth herein.

Figure 1:
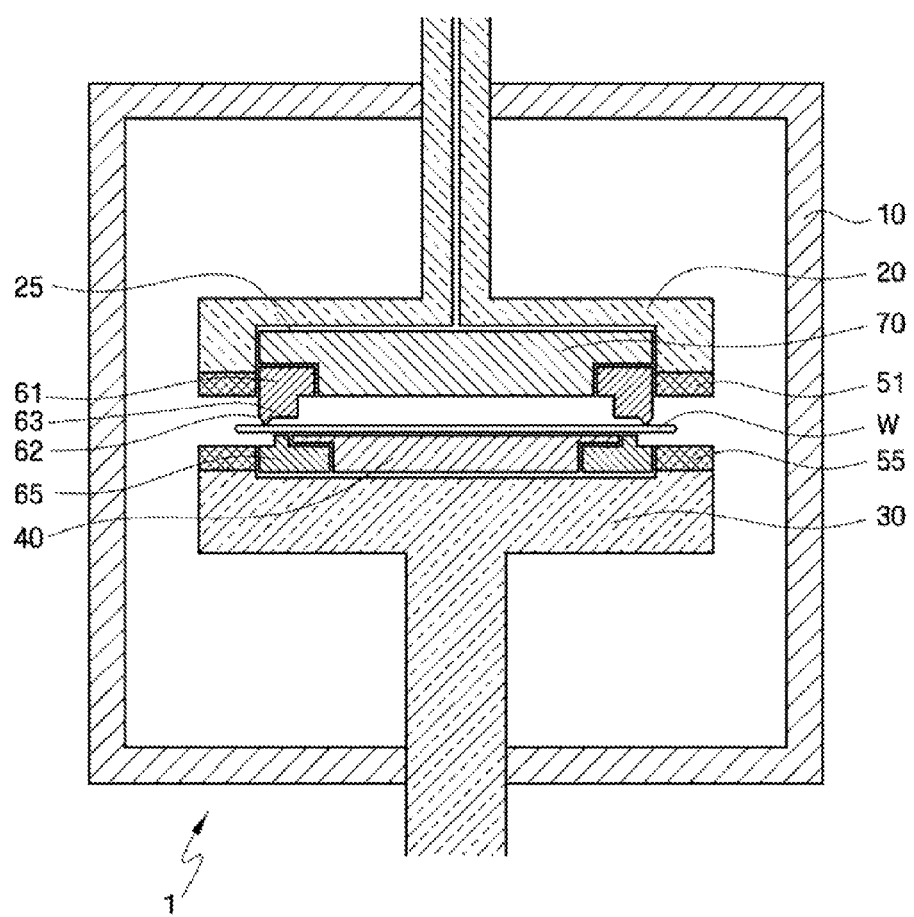
FIG. 1 is a sectional view of an apparatus for etching an edge of a wafer according to an embodiment of the present invention.
Figure 2:
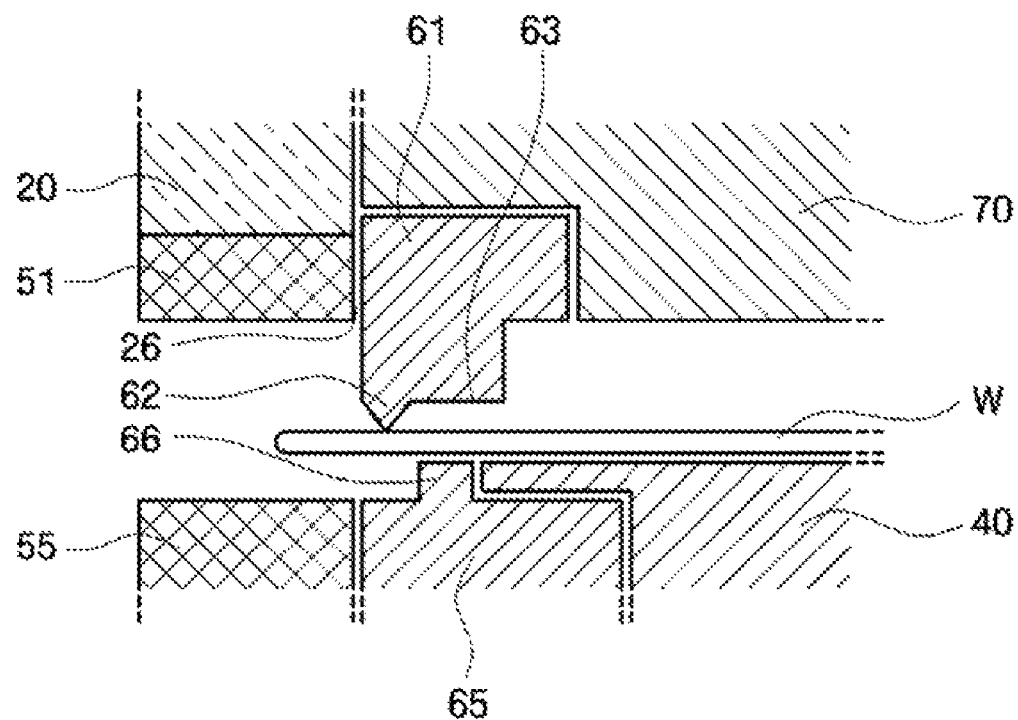
FIG. 2 is a partly enlarged sectional view of the apparatus of FIG. 1.
Figure 3:
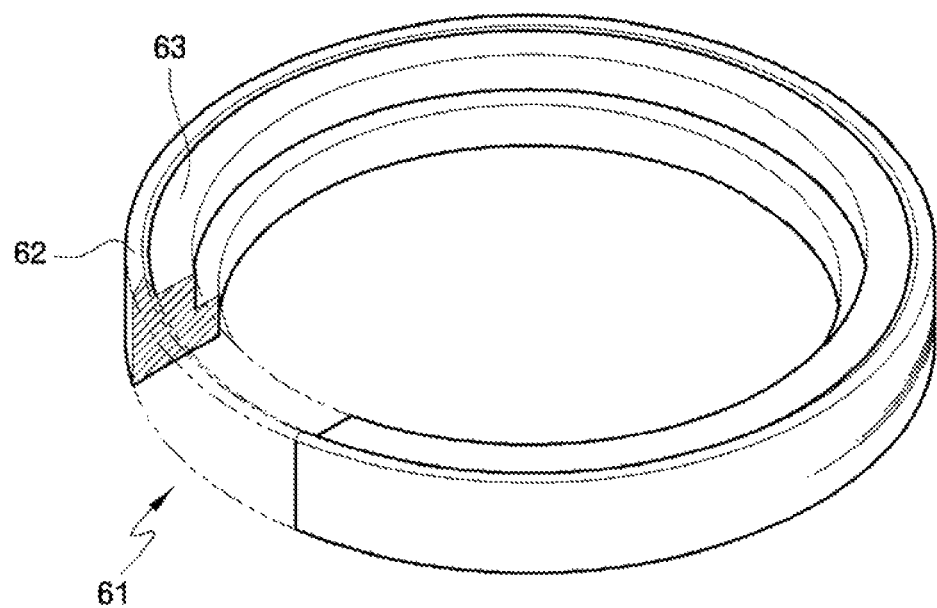
FIG. 3 is an exploded perspective view of an edge ring of the apparatus of FIG. 1.
Figure 4:
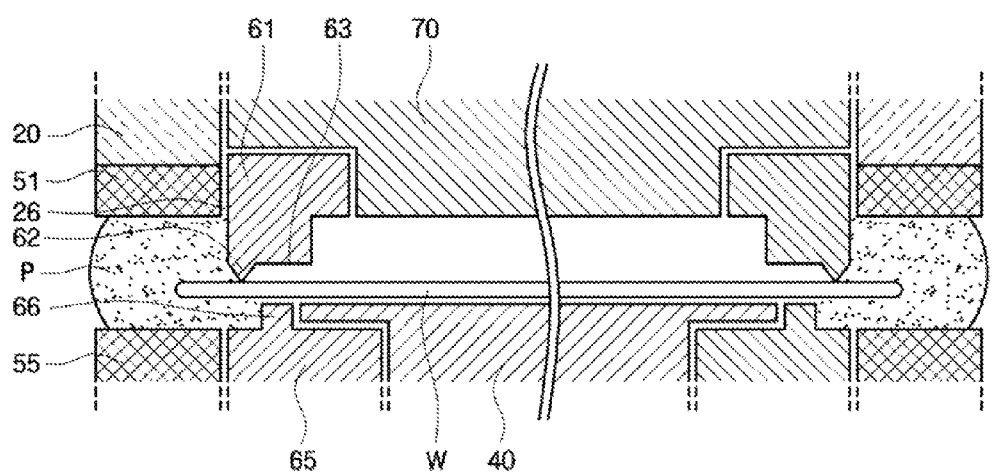
FIG. 4 is a sectional view for illustrating an operation of the apparatus of FIG. 1.

Hereinafter, an apparatus for etching an edge of a wafer according to an embodiment of the present invention will be described in detail with reference to FIGS. 1 through 4. FIG. 1 is a sectional view of an apparatus for etching an edge of a wafer according to an embodiment of the present invention, and FIG. 2 is a partly enlarged sectional view of the apparatus of FIG. 1. FIG. 3 is an exploded perspective view of an edge ring of the apparatus of FIG. 1, and FIG. 4 is a sectional view for illustrating an operation of the apparatus of FIG. 1.

Referring to FIGS. 1 and 2, an apparatus 1 for etching an edge of a wafer according to an embodiment of the present invention includes a chamber 10, an upper insulator 20, a lower insulator 30, a chuck 40, an upper electrode 51, a lower electrode 55, an edge ring 61, a blocking ring 65, a plate 70, a gas supplying pipe 25, and a gas nozzle 26.

The chamber 10 provides for a space in which a wafer W is to be disposed and for an etching process to be performed on the wafer W. The chamber 10 forms enough space to house the upper insulator 20, the lower insulator 30, the chuck 40, the upper electrode 51, the lower electrode 55, the edge ring 61, the blocking ring 65, the plate 70, the gas supplying pipe 25, and the gas nozzle 26. In addition, the chamber 10 is constructed sufficiently rigid to maintain the interior thereof as a vacuum.

The chamber 10 may be formed of various sizes and shapes according to the size of the wafer W on which the etching process is to be performed. An entrance (not shown) through which the wafer W may be inserted into and out of the chamber 10 may be formed at the chamber 10. Also, a vacuum pump (not shown) may be attached to the chamber 10 that maintains an internal pressure of the chamber 10 in a vacuum environment.

The chuck 40 is disposed inside the chamber 10 and provides a mounting surface on which the wafer W is disposed. The wafer W is mounted on a top surface of the chuck 40 and etched by an etching gas.

The chuck 40 may be a vacuum chuck which vacuum adsorbs the wafer W to fix the wafer W, or an electrostatic chuck which fixes the wafer W using an electrostatic force. The chuck 40 may be shaped as a disc having a diameter smaller than that of the wafer W. Thus, an edge of the wafer W mounted on the chuck 40 may protrude outside the chuck 40.

The blocking ring 65 is combined with an outer periphery of the chuck 40 along the edge of the wafer W. The blocking ring 65 prevents an etching gas and/or a plasma etching gas, which is an etching gas treated by plasma (see item P of FIG. 4), from penetrating the lower portion of the wafer W. A blocking protrusion 66 is formed at an upper part of the blocking ring 65. The blocking protrusion 66 protrudes upward from the upper part of the blocking ring 65 to come into close contact with a bottom surface of the wafer W, thereby effectively blocking the etching gas and/or the plasma etching gas P from penetrating the lower portion of wafer W and protecting the chuck 40 against the etching gas and/or the plasma etching gas P. The blocking protrusion 66 has substantially the same height as the top surface of the chuck 40.

The lower insulator 30 is disposed under the chuck 40 and the blocking ring 65. The lower insulator 30 supports the chuck 40 and the blocking ring 65 and extends through the lower portion of the chamber 10 to protrude outside the chamber 10. The lower insulator 30 may be made of a material such as ceramic or quartz.

The plate 70 is disposed above the wafer W opposed to the chuck 40. The plate 70 prevents a central region of the wafer W from being etched by the plasma etching gas P and is shaped as a disc having a diameter slightly smaller than that of the wafer W. The plate 70 partially overlaps with the wafer W to expose the edge of the wafer W, and shields the central region of the wafer W. Thus, the edge of the wafer W, or a predetermined region of the wafer W extending from the edge of the wafer W to an inside part of the wafer W, does not overlap with the plate 70 and thus is exposed to the plasma etching gas P.

The plate 70 is spaced a predetermined distance apart from the wafer W to avoid direct contact with the wafer W. The predetermined distance between the plate 70 and the wafer W may be minimized to prevent penetration of the plasma.

The plate 70 is made of an insulator, such as ceramic or quartz. Although not shown, a hole (not shown), through which a blocking gas is injected for blocking plasma generation and penetration, may be formed at a side of the plate 70.

The edge ring 61 is formed along the edge of the wafer W and is combined with an outer periphery of the plate 70. The edge ring 61 prevents the plasma etching gas P from penetrating the central region of the wafer W.

The plate 70 prevents the central region of the wafer W from being exposed to the plasma etching gas P. However, since the plate 70 is spaced the predetermined distance apart from the wafer W, a predetermined amount of the plasma etching gas P may penetrate the central region of the wafer W.

However, if the plate 70 comes into contact with the wafer W, the wafer W may be damaged. Thus, the plate 70 is spaced the predetermined distance from the wafer W, which allows the predetermined amount of the plasma etching gas P to penetrate into the space between the plate 70 and the wafer W. Therefore, the edge ring 61 is formed to prevent the plasma etching gas P from penetrating the space between the plate 70 and the wafer W.

Referring to FIGS. 2 and 3, the edge ring 61 includes a ring base 63 which forms a surface of the edge ring 61 opposed to the wafer W and a ring protrusion 62 which protrudes from the ring base 63.

The ring base 63 is spaced a predetermined distance apart from the wafer W to establish a parallel plane with respect to the wafer W. As such, the ring protrusion 62 protrudes downward from the ring base 63.

The ring protrusion 62 is formed such that it protrudes from the ring base 63, has a ring shape, and comes into contact with an edge of the edge ring 61. The ring protrusion 62 is spaced a predetermined distance apart from the edge of the wafer W toward the central region of the wafer W.

The ring protrusion 62 may be formed such that it protrudes from the ring base 63 to either come into contact with the wafer W, or to be spaced a predetermined distance apart from the wafer W. The ring protrusion 62 either contacts the wafer W or is spaced apart from the wafer W by a minimum, predetermined distance, thereby preventing the plasma etching gas P from penetrating the wafer W.

The ring protrusion 62 is formed at an edge portion of the edge ring 61. In other words, a bottom surface of the edge ring 61 includes the ring base 63 and the ring protrusion 62, with the ring base 63 being enclosed by the ring protrusion 62. Here, the ring base 63 has a width greater than that of the ring protrusion 62. Therefore, although the plasma etching gas P may pass between the ring protrusion 62 and the wafer W, the plasma etching gas P may fail to pass between the ring base 63 and the wafer W due to a relatively larger width of the ring base 63.

A cross-sectional area of the ring protrusion 62 gradually decreases toward the wafer W. That is to say, to minimize a contact area with the wafer W, an end of the ring protrusion 62 may be sharpened. Thus, the ring protrusion 62 may line-contact the wafer W.

The ring protrusion 62 is disposed on the wafer W opposite to the blocking protrusion 66 of the blocking ring 65, with the wafer W therebetween.

Referring back to FIGS. 1 and 2, the upper insulator 20 is provided above the plate 70 and the edge ring 61. The upper insulator 20, made of an insulator such as ceramic or quartz, insulates the upper electrode 51.

The upper electrode 51 is combined with a part of the upper insulator 20 that is disposed along an outer periphery of the edge ring 61. The upper electrode 51 overlaps the edge of the wafer W. Radio frequency (RF) power of, for example, about 600 W, may be applied to the upper electrode 51.

The lower electrode 55 is provided on the lower insulator 30 along an outer periphery of the blocking ring 65 to be opposed to the upper electrode 51. The lower electrode 55 is disposed opposite to the upper electrode 51 with the wafer W therebetween.

The upper and lower electrodes 51 and 55 have the same area. RF power of, for example, about 600 W, may be applied to the lower electrode 55, like the upper electrode 51.

If power is applied to the upper and lower electrodes 51 and 55, an etching gas between the upper and lower electrodes 51 and 55 is turned into plasma.

The etching gas is supplied through the gas supplying pipe 25 provided in the upper insulator 20. The gas supplying pipe 25 penetrates the upper insulator 20 and supplies the etching gas into the chamber 10.

The gas supplying pipe 25 is connected to the gas nozzle 26, and the etching gas is sprayed onto the edge of the wafer W through the gas nozzle 26.

The gas nozzle 26 may be provided between the edge ring 61 and the upper electrode 51. That is to say, the gas nozzle 26 may be provided at a position at which the etching gas can be directly sprayed onto the edge of the wafer W.

The etching gas may vary according to a target material to be etched. For example, if Al is to be etched, a mixed gas of $Cl_2$, $BCl_3$, $N_2$ and the like may be used as the etching gas. If $SiN_x$ is to be etched, a mixed gas of $SF_6$, $CF_4$, and the like may be used as the etching gas. If an oxide layer is to be etched, a mixed gas of $O_2$, $CF_4$, $CHF_3$ and the like may be used as the etching gas.

Here, the internal pressure of the chamber 10 may be maintained between about 120 mTorr and about 130 mTorr or between about 170 mTorr and about 180 mTorr. The internal pressure of the chamber 10 may vary according to the target material to be etched.

A process of etching the edge of a wafer W will now be described with reference to FIG. 4. The etching gas is supplied to the edge of the wafer W through the gas nozzle 26.

The etching gas may be sprayed between the upper and lower electrodes 51 and 55 or directly onto a surface of the edge of the wafer W. Here, the edge ring 61 and the blocking ring 65 prevent the etching gas from penetrating the space above the central region of the wafer W. Accordingly, the etching gas is present primarily in the region about the edge of the wafer W.

After the etching gas has been supplied, RF power is applied to the upper and lower electrodes 51 and 55, thereby inducing plasma between the upper and lower electrodes 51 and 55. In other words, the etching gas is turned into plasma to etch the edge of the wafer W.

As described above, since the plasma etching gas P does not pass through the ring protrusion 62 of the edge ring 61, the edge of the wafer W is etched, and the central region of the wafer W is not etched. Therefore, a foreign substance attached to the edge of the wafer W may be selectively etched.

Figure 5:
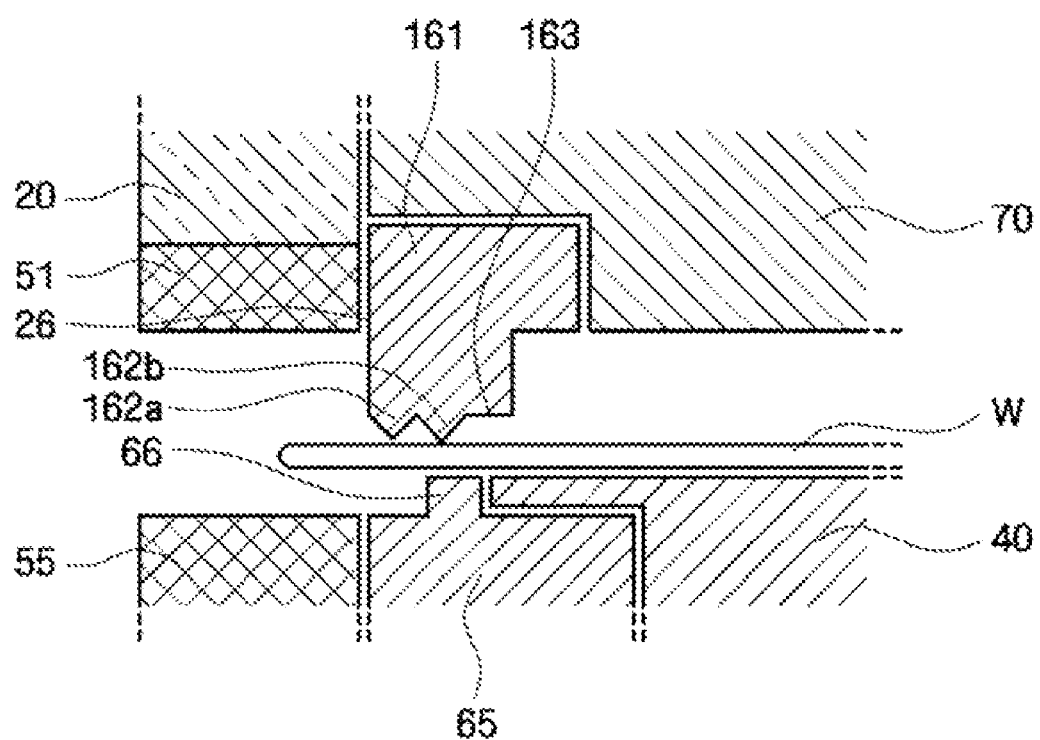
FIG. 5 is a partly enlarged sectional view of an apparatus for etching an edge of a wafer, according to another embodiment of the present invention.
Figure 6:
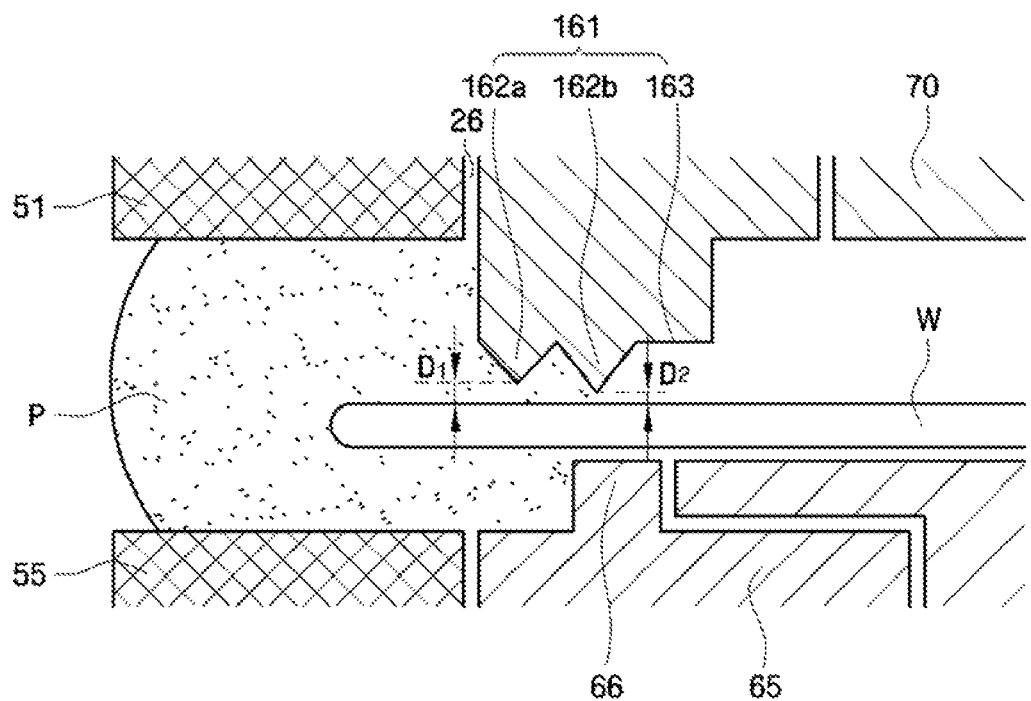
FIG. 6 is a partially enlarged sectional view for illustrating an operation of the apparatus of FIG. 5.
Figure 7:
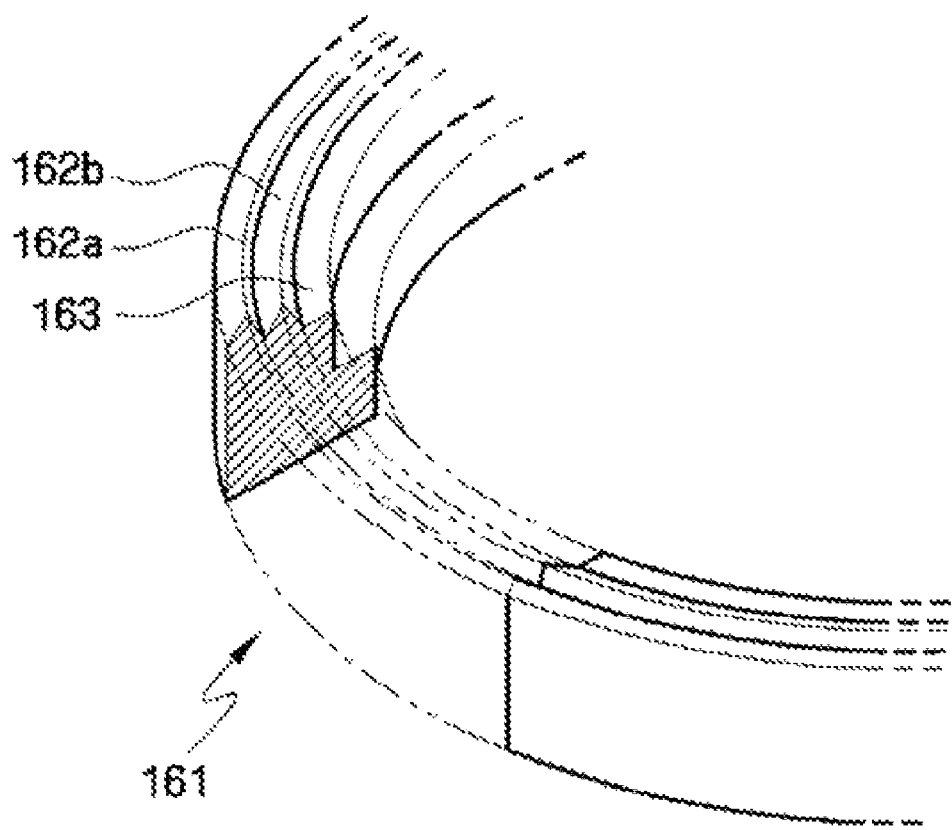
FIG. 7 is an exploded perspective view of an edge ring of the apparatus of FIG. 5.

Hereinafter, an apparatus for etching an edge of a wafer according to another embodiment of the present invention will be described in detail with reference to FIGS. 5 through 7. FIG. 5 is a partly enlarged sectional view of an apparatus for etching an edge of a wafer, according to another embodiment of the present invention. FIG. 6 is a partially enlarged sectional view for illustrating an operation of the apparatus of FIG. 5. FIG. 7 is an exploded perspective view of an edge ring of the apparatus of FIG. 5. For the sake of convenience, corresponding elements of an apparatus of the present embodiment and an apparatus of a previous embodiment are denoted by the same reference numerals, and their descriptions will not be given.

An apparatus of the present embodiment includes an edge ring 161 which includes first and second ring protrusions 162a and 162b.

The edge ring 161 is provided along an edge of a wafer W and is combined with an outer periphery of a plate 70. The edge ring 161 prevents plasma from penetrating a space above the central region of the wafer W.

The edge ring 161 includes a ring base 163 which forms a surface of the edge ring 161 facing the wafer W and the first and second ring protrusions 162a and 162b which protrude from the ring base 163.

The ring base 163 is spaced apart from the wafer W and forms a parallel plane with respect to the wafer W. As such, the first and second ring protrusions 162a and 162b protrude downward from the ring base 163.

The first and second ring protrusions 162a and 162b, which protrude from the ring base 163 along the edge ring 161, are shaped as a double ring. The first ring protrusion 162a may be disposed along the outer periphery of the second ring protrusion 162b.

The first and second ring protrusions 162a and 162b may be formed such that they protrude from the ring base 163 to either come into contact with the wafer W or be spaced a predetermined distance apart from the wafer W. As described in the embodiments of FIGS. 1 to 4, the first and second ring protrusions 162a and 162b serve to substantially block plasma etching gas P from penetrating into a space above the central region of the wafer W. In addition, the first and second ring protrusions 162a and 162b overlap each other, forming a double blocking structure.

In detail, referring to FIG. 6, a distance $D_1$ between the first ring protrusion 162a and the wafer W may be greater than a distance $D_2$ between the second ring protrusion 162b and the wafer W. To minimize damage to the wafer W, the wafer W may be constructed such that the first and second ring protrusions 162a and 162b do not contact the wafer W. Therefore, the first and second ring protrusions 162a and 162b may be spaced apart from the wafer W. Here, if the first and second ring protrusions 162a and 162b are spaced a sufficiently small distance apart from the wafer W, the first and second ring protrusions 162a and 162b will probably come into contact with the wafer W. Accordingly, the plasma etching gas P is primarily blocked by making the distance $D_1$ between the first ring protrusion 162a and the wafer W the larger distance, and secondarily blocked by making the distance $D_2$ between the second ring protrusion 162b and the wafer W the smaller distance.

As described above, plasma is prevented from penetrating into the space above the central region of the wafer W due to the small distance created between the ring protrusions 162a and 162b and the wafer W.

Figure 8:
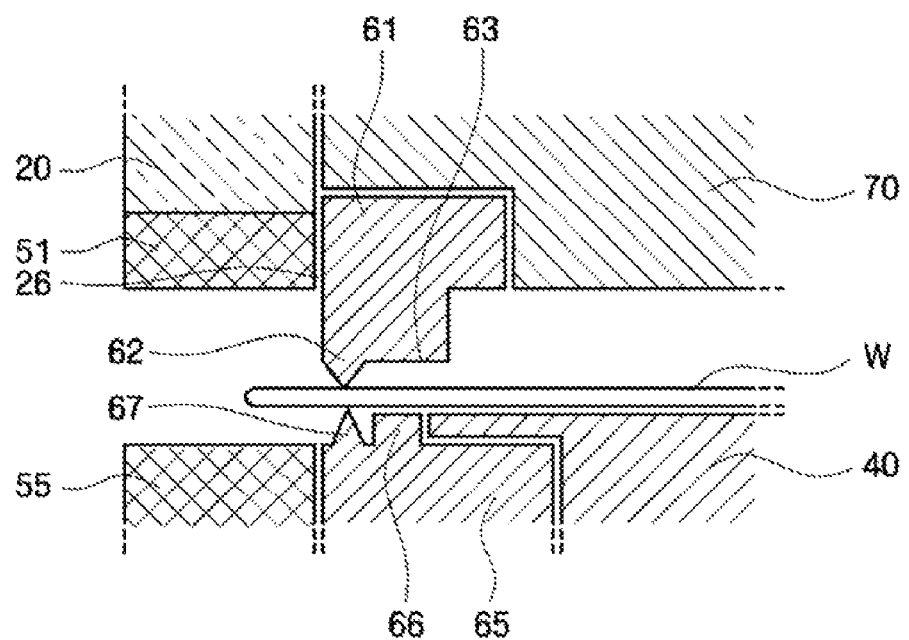
FIG. 8 is a partly enlarged sectional view of an apparatus for etching an edge of a wafer, according to another embodiment of the present invention.

Hereinafter, an apparatus for etching an edge of a wafer according to another embodiment of the present invention will be described in detail with reference to FIG. 8. FIG. 8 is a partly enlarged sectional view of an apparatus for etching an edge of a wafer, according to another embodiment of the present invention. For the sake of convenience, corresponding elements of an apparatus of a present embodiment and of previous embodiments shown in FIGS. 1 to 5 are denoted by the same reference numerals, and their descriptions will not be given.

An apparatus according to a present embodiment includes a blocking ring 65 which includes first and second blocking protrusions 66 and 67.

The blocking ring 65 prevents a plasma etching gas, such as gas P of FIG. 4, from penetrating under the lower portion of the wafer W, and the first and second blocking protrusions 66 and 67 protrude from the blocking ring 65 toward the wafer W.

The first blocking protrusion 66 blocks penetration of the plasma etching gas P as described in previous embodiments and forms a mounting space along with a chuck 40, wherein the wafer W is mounted on the mounting space. The first blocking protrusion 66 has the same height as the chuck 40.

The second blocking protrusion 67 is formed at an outer periphery of the first blocking protrusion 66 along the blocking ring 65. The first and second blocking protrusions 66 and 67 are shaped as a ring along an edge of the wafer W.

The first and second blocking protrusions 66 and 67 block the plasma etching gas P from penetrating a lower portion of the wafer W. An end of the first blocking protrusion 66 is sharpened, thereby minimizing a contact area between the first blocking protrusion 66 and the wafer W.

Here, at least one of the first and second blocking protrusions 66 and 67 may be disposed opposite to the ring protrusion 62 with the wafer W therebetween.

The plasma etching gas P may form a doughnut shape between upper and lower electrodes 51 and 55 along the edge of the wafer W. The plasma etching gas P is blocked from penetrating into the space above a central region of the wafer W along a surface of the wafer W by the ring protrusion 62 and the first and second blocking protrusions 66 and 67. That is to say, the plasma etching gas P is blocked from penetrating along a top surface of the wafer W by the ring protrusion 62, while the plasma etching gas P is blocked from penetrating along a bottom surface of the wafer W by the first and second blocking protrusions 66 and 67.

While embodiments of the present invention has been particularly shown and described with reference to exemplary embodiments thereof, it will be understood by those of ordinary skill in the art that various changes in form and details may be made therein without departing from the spirit and scope of embodiments of the present invention as defined by the following claims. It is therefore desired that the present embodiments be considered in all respects as illustrative and non-limiting, reference being made to the appended claims rather than the foregoing description to indicate the scope of the embodiments of the invention.

What is claimed is:

1. An apparatus for etching an edge of a wafer, comprising: a chamber; a chuck disposed inside the chamber upon which a wafer is disposed;
a plate spaced apart from the wafer and disposed above the wafer;
and an edge ring formed along an outer periphery of the plate, wherein the edge ring comprises a ring base extending downward from the plate and spaced a distance apart from the wafer to form a parallel plane with respect to the wafer, and a first ring protrusion protruding from the ring base to the wafer and tapering downward to form a tip to insulate the edge of the wafer from a central region of the wafer, wherein the first ring protrusion is formed at an edge portion of the edge ring so as to enclose the ring base, and
wherein the first ring protrusion contacts a surface of the wafer.

2. The apparatus of claim 1, wherein the first ring protrusion is shaped as a ring having a diameter smaller than that of the wafer and is disposed inward relative to the edge of the wafer.

3. The apparatus of claim 2, wherein a cross-sectional area of the first ring protrusion decreases gradually toward the wafer.

4. The apparatus of claim 2, further comprising a second ring protrusion protruding from the ring base and having a diameter smaller than a diameter of the first ring protrusion.

5. The apparatus of claim 4, wherein a distance between a tip of the first ring protrusion and the wafer is greater than a distance between a tip of the second ring protrusion and the wafer.

6. The apparatus of claim 1, further comprising a blocking ring disposed under the wafer and formed along an outer periphery of the chuck.

7. The apparatus of claim 6, wherein the blocking ring comprises one or more blocking protrusions which protrude from the blocking ring toward the wafer.

8. The apparatus of claim 7, wherein the blocking protrusions are disposed opposite of the first ring protrusion with the wafer disposed therebetween.

9. The apparatus of claim 1, further comprising:
upper and lower electrodes disposed opposite to each other with the edge of the wafer disposed therebetween; and
a gas nozzle disposed outside the first ring protrusion to supply an etching gas.

10. An apparatus for etching an edge of a wafer, comprising:
a chamber; a chuck disposed inside the chamber adapted for receiving a wafer;
a plate spaced apart from and disposed above the chuck forming a space there-between;
an edge ring formed along an outer periphery of the plate having a ring base extending downward from the plate and a first ring protrusion protruding down from the ring base toward the chuck and tapering to form a tip, and wherein the first ring protrusion is formed at an edge portion of the edge ring so as to enclose the ring base;
a gas nozzle disposed outside the first ring protrusion to supply an etching gas, and
wherein said first ring protrusion is disposed inward relative to an edge of a wafer disposed on said chuck and contacts a surface of the wafer to prevent the etching gas from penetrating into a space above a central region of the wafer.

11. The apparatus of claim 10, wherein said ring base is spaced a distance above a wafer disposed on said chuck to form a plane parallel to the wafer, and wherein said first ring protrusion tapers to form a tip.

12. The apparatus of claim 10, further comprising a second ring protrusion protruding from the ring base to from a tip and disposed inward of the first ring protrusion.

13. The apparatus of claim 12, wherein the tip of the second ring protrusion extends lower that the tip of the first ring protrusion.

14. The apparatus of claim 10, further comprising a blocking ring disposed under the edge ring and formed along an outer periphery of the chuck.

15. The apparatus of claim 14, wherein the blocking ring comprises one or more blocking protrusions protruding from the blocking ring and disposed opposite of the first ring protrusion.

16. The apparatus of claim 14, further comprising:
an upper electrode disposed about a periphery of said edge ring; and
a lower electrode disposed about a periphery of said blocking ring, wherein said upper and lower electrodes face each other.

* * * * *